United States Patent
Reiss et al.

(10) Patent No.: US 7,764,064 B2
(45) Date of Patent: Jul. 27, 2010

(54) SAMPLE EXCHANGE DEVICE HAVING A SAMPLE RECEPTACLE GUIDED THROUGH A MEANDERING PATH, IN PARTICULAR FOR AN NMR SPECTROMETER

(75) Inventors: Volker Reiss, Jockgrim (DE); Frank Schneider, Karlsruhe (DE); Markus Streckfuss, Rheinstetten (DE)

(73) Assignee: Bruker Biospin GmbH, Rheinstetten (DE)

( * ) Notice: Subject to any disclaimer, the term of this patent is extended or adjusted under 35 U.S.C. 154(b) by 68 days.

(21) Appl. No.: 12/219,478

(22) Filed: Jul. 23, 2008

(65) Prior Publication Data

US 2009/0072830 A1 Mar. 19, 2009

(30) Foreign Application Priority Data

Sep. 14, 2007 (DE) ................ 10 2007 044 016

(51) Int. Cl.
*G01V 3/00* (2006.01)
(52) U.S. Cl. ................ 324/318; 324/307; 324/309; 324/321
(58) Field of Classification Search .......... 324/300–322
See application file for complete search history.

(56) References Cited

U.S. PATENT DOCUMENTS

| | | | | |
|---|---|---|---|---|
| 3,351,177 A | * | 11/1967 | Mulligan | 198/346.2 |
| 3,487,678 A | * | 1/1970 | Eveleigh et al. | 73/864.85 |
| 3,587,676 A | * | 6/1971 | Oehlin et al. | 41/130 |
| 3,905,482 A | * | 9/1975 | Knulst | 211/74 |
| 4,039,286 A | | 8/1977 | Keller | |
| 4,121,465 A | | 10/1978 | Harris | |
| 4,335,610 A | * | 6/1982 | Scott | 73/865.5 |
| 4,581,583 A | * | 4/1986 | Van Vliet et al. | 324/321 |
| 4,882,972 A | | 11/1989 | Raymond | |
| 5,032,361 A | * | 7/1991 | Kleinhappl et al. | 422/67 |
| 5,220,302 A | * | 6/1993 | Nunnally et al. | 335/301 |
| 5,534,780 A | * | 7/1996 | Lilly | 324/321 |
| 5,635,840 A | * | 6/1997 | Horigane et al. | 324/321 |
| 5,897,835 A | * | 4/1999 | Seaton et al. | 422/104 |

(Continued)

FOREIGN PATENT DOCUMENTS

DE          133 363          10/1980

(Continued)

OTHER PUBLICATIONS

"BACS Automtatic Sample Changer", www.bruker-biospin.com, 2007.
"Sample Rail", www.bruker-biospin.com, 2007.

*Primary Examiner*—Brij B Shrivastav
*Assistant Examiner*—Dixomara Vargas
(74) *Attorney, Agent, or Firm*—Paul Vincent

(57) ABSTRACT

A sample exchange device (1), in particular, for an NMR spectrometer, comprising a circumferential chain (22), sample receptacles (7) which are disposed on the chain (22) at equal distances and are connected to each other via webs (23), and a measuring or transfer position (9), wherein each sample receptacle (7) can be moved to the measuring or transfer position (9) by moving the chain (22), characterized in that a chain guidance is provided which guides the circumferential chain (22) along a meandering path. The inventive sample exchange device is particularly economic and does not impair the analysis of the samples.

15 Claims, 4 Drawing Sheets

U.S. PATENT DOCUMENTS

| | | | |
|---|---|---|---|
| 6,790,413 B2* | 9/2004 | Ngo et al. | 422/65 |
| 7,102,354 B2* | 9/2006 | Ardenkjaer-Larsen et al. | 324/321 |
| 7,276,208 B2* | 10/2007 | Sevigny et al. | 422/104 |
| 7,372,274 B2* | 5/2008 | Ardenkjaer-Larsen et al. | 324/321 |
| 7,510,683 B2* | 3/2009 | Itoh | 422/65 |
| 2002/0164269 A1* | 11/2002 | Ngo et al. | 422/63 |
| 2004/0053318 A1* | 3/2004 | McWilliams et al. | 435/6 |
| 2004/0251904 A1 | 12/2004 | Corver | |
| 2009/0017491 A1* | 1/2009 | Lemme et al. | 435/40.52 |

FOREIGN PATENT DOCUMENTS

| | | |
|---|---|---|
| DE | 103 12 359 | 9/2004 |
| EP | 0 337 735 | 10/1989 |
| JP | 10148601 | 11/1996 |

* cited by examiner

SAMPLE EXCHANGE DEVICE HAVING A SAMPLE RECEPTACLE GUIDED THROUGH A MEANDERING PATH, IN PARTICULAR FOR AN NMR SPECTROMETER

This application claims Paris Convention priority of DE 10 2007 044 016.4 filed Sep. 14, 2007 the complete disclosure of which is hereby incorporated by reference.

BACKGROUND OF THE INVENTION

The invention concerns a sample exchange device comprising a circumferential chain, sample receptacles which are disposed on the chain at equal distances and are connected to each other via webs, and a measuring and transfer position, wherein each sample receptacle can be transferred to the measuring and transfer position by moving the chain.

A sample exchange device of this type has been disclosed by the commercially available automatic sample exchanger "B-ACS60/120" by Bruker BioSpin GmbH, Rheinstetten, DE.

Spectroscopic methods are frequently used in instrumental analysis for examining the chemical composition of samples.

In NMR spectroscopy, for measuring a sample, the sample is e.g. moved to a strong static magnetic field and radio frequency (RF) pulses are irradiated into the sample. The reaction of the sample to the RF pulses is measured. The static magnetic field is generated by superconducting magnet coils. In modern NMR spectrometers, the magnet coils are cooled with liquid helium in a cryostat.

In order to maximize economical use of a spectrometer, the time required for changing between different samples should be minimized. In order to obtain a high sample throughput in spectrometers, automatic sample exchangers are normally used.

Automatic sample exchange in NMR spectrometers is realized by transferring a sample from a sample storage (containing a plurality of samples) to a measuring location in the room temperature bore (for example a vertical neck tube) of the cryostat and back.

The above-mentioned sample exchange device "B-ACS 60/120" by Bruker BioSpin GmbH for NMR spectrometers comprises an approximately ovally spanned, circumferential chain comprising a plurality of sample receptacles. The circumferential chain is spanned by two flatly oriented discs. Each sample receptacle may be provided with one sample (typically one glass capillary as a sample container including a substance to be measured inside the sample container, comprising a sample holder mounted to the sample container including a closing lid for the sample container). A transfer means may access a given sample when the associated sample receptacle is disposed at a certain transfer position, and move it to the neck tube of a cryostat. By moving the circumferential chain, each sample receptacle can be moved to the transfer position. This conventional sample exchange device is advantageous in view of the simple construction of the transfer means which requires only two directions of motion with stops and can be pneumatically operated. The circumferential chain can be driven using a simple construction, and also in a pneumatic fashion. This eliminates disturbance of the NMR measurement. The fact that the chain including sample receptacles require a great deal of space is, however, disadvantageous. Automatic devices for sample preparation additionally generally provide samples having rectangular sample grid in sample libraries, such that, in general, automatically prepared samples must be initially transferred to the circumferential chain.

There are further automatic sample exchangers of the type "SampleRail" for NMR spectrometers, disclosed by the company Bruker BioSpin GmbH, Rheinstetten, DE, which cooperate with an xyz robot arm that directly accesses samples from a sample library and moves them to the neck tube of a cryostat. Transfer of automatically prepared samples is thereby omitted, but the electromotive drive of the xyz robot arm could disturb the NMR measurement. With different motor settings, in particular, the magnetic stray field may vary, thereby falsifying the NMR measuring results.

It is the underlying purpose of the present invention to provide an automatic sample exchange device, in particular, for NMR spectrometers, which is particularly economical and does not impair the analysis of the samples.

SUMMARY OF THE INVENTION

This object is achieved by a sample exchange device of the above-mentioned type which is characterized in that a chain guidance is provided which guides the circumferential chain along a meandering path.

The meandering path of the circumferential chain considerably reduces the space required for the samples that are intermediately stored in the sample exchange device. Instead of using only the outer periphery of a surface area as a sample storage, the invention also utilizes the inside of a surface area as a sample storage. The meandering path thereby forms a plurality of loops which are typically disposed next to each other or engage into one another. In accordance with the invention, preferably one complete surface area, i.e. all of it, is substantially utilized for sample storage, without leaving any unused partial surfaces within the outer periphery. This increases the storage density of the samples. The reduced space requirements reduce costs.

In accordance with the invention, the samples can be moved from the sample storage (in this case all sample receptacles of the circumferential chain) to the measuring location using very simple drive constructions. Only a few linear degrees of freedom are required for the sample. The one-dimensional drive of the circumferential chain is very simple to set up. The fixedly defined transfer or measuring position permits utilization of standardized mechanical stops both for precisely moving the chain and also for grasping and depositing the samples or sample containers. Complicated control methods for determining the position and for positioning are not required. On/off controls for all drive functions are generally sufficient. Components that could disturb spectroscopic measurement (such as permanent magnets of electromotors) can be easily disposed far away from the measuring location due to the simple drive construction, or be completely omitted (e.g. due to the pneumatic drive).

The chain guidance preferably guides the chain on a flat path, typically in a horizontal plane.

In some embodiments, the samples can be measured directly at a measuring position, e.g. in optical spectrometers. In other embodiments, they are transferred to a transfer position for being transferred to a final measuring location in an analysis device, e.g. in an NMR spectrometer.

In one particularly preferred embodiment of the inventive sample exchange device, the sample exchange device comprises a cassette in which a meandering, self-contained guiding channel is formed as a chain guidance. The guiding channel acts as the chain guidance, i.e. it forces the circumferential chain along the meandering path. The overall chain or only parts of it (e.g. with positioning pins) may thereby be disposed in the guiding channel. The cassette (including the circumferential chain disposed therein) can be handled independently of the other components of the sample exchange device (e.g. a transfer means for transferring samples from the transfer position to the measuring location), e.g. in order to quickly exchange a set of samples in a first cassette with a second set of samples in a second cassette at the sample exchange device. It must be noted that the guiding channel can cooperate with the sample receptacle in order to hold a sample in a sample receptacle. The guiding channel may also contain a closable opening, in particular at the transfer position, in order to facilitate transfer of the sample at the transfer position. The guiding channel may furthermore be designed in stages (e.g. in order to guide a sample using a sample holder, which is wider than a sample container of the sample) and/or have an opening area (e.g. in order to permit projection of a tubular sample container through it).

In one advantageous further development of this embodiment, the width B of the guiding channel substantially corresponds to the outer diameter D of the sample receptacles. This ensures secure guidance of the chain without jamming. It must be noted that the sample receptacles are generally circular at the outside (and in most cases also inside) and the sample receptacles represent the chain parts having the largest outer dimensions of the chain.

In a preferred further development of the above-mentioned embodiment, the guiding channel is exclusively designed of
   straight sections and
   90° bends and/or 180° bends. This further development facilitates formation of regular grids (in particular rectangular grids) of the sample receptacles. Regular grids facilitate automatic charging (and discharging) of the cassette with samples, e.g. after automatic sample preparation. This further development moreover leads to high packing densities of samples on the cassette.

In one particularly preferred further development, the walls of the guiding channel in the bends and the outer contours of the sample receptacles and the webs are designed in such a fashion that the length of the chain is not changed while it moves around the bends. This prevents jamming and ensures easy mobility of the chain in the guiding channel. It must be noted that the chain is normally produced of a material that is relatively resistant to deformation (preferably a non-ferromagnetic material, in particular plastic materials or metals such as aluminium, brass, etc.) and, at the most, can only be slightly elastically deformed.

In another advantageous further development, the cassette has a cassette bottom which has a bottom opening at the transfer position for passage of a sample. This facilitates transfer of a sample from a sample receptacle at the transfer position to the measuring location of a spectrometer.

A preferred further development comprises a movable closing mechanism for closing an opening in the guiding channel at the transfer position. The opening facilitates transfer of a sample from the sample receptacle at the transfer position to a remote measuring location in an analysis device. The opening in the guiding channel can be closed, in particular, for moving the chain and/or transporting the cassette. The opening is e.g. provided at the bottom of the guiding channel. It must be noted that it may also be sufficient for the closing mechanism to close only part of the opening in the guiding channel (in particular, when the samples together with the sample receptacles can be reliably held in the chain through partial closure). The closing mechanism is preferably formed in the cassette but may also be realized separately from the cassette, e.g. as a displaceable cover of the opening which is formed on a transfer means (for transferring the sample from the transfer position to the measuring location).

In one particularly preferred embodiment of the inventive sample exchange device, the sample receptacles form a square grid in a transport position of the chain. In the transport position, in which the sample receptacles form a square grid, the circumferential chain can be easily fully automatically loaded (or unloaded) e.g. during fully automatic sample preparation. In this transport position, a sample receptacle is usually also disposed at the transfer position. It must be noted that, in this embodiment having a square grid of sample receptacles, a new transport position is reached when the chain is moved by the separation between two neighboring sample receptacles.

In one further preferred embodiment of an inventive sample exchange device, the outer diameter D of the sample receptacles and the separation A between the sample receptacles disposed next to one another on the chain, measured from center to center, is: $2 \geq A/D \geq 5/4$. This practically tested dimensional range yields a good packing density of the sample receptacles, and guidance of the chain around 90° and 180° curves is possible without tensioning the chain. For smaller A/D ratios, either the wall thicknesses of the guiding channel must be selected to be very small or the preferred geometries of the guiding channel (e.g. only 90° and 180° curves and/or square grids) must be altered. Larger A/D ratios reduce the packing density of the sample receptacles.

In another advantageous embodiment, the chain has a drive that drives the chain at least two different drive locations, wherein the number of drive locations preferably corresponds to the number of rows of sample receptacles of the sample exchange device. Several drive locations (e.g. tensioning hooks or the like) prevent jamming of the chain that could occur due to the play of the chain e.g. in the chain guidance. If the sample exchange device comprises a cassette, the drive is preferably formed in the sample exchange device separately from the cassette.

In another preferred embodiment, a retractable stop is provided for aligning the sample receptacles with respect to the transfer position. The retractable stop facilitates exact positioning of the sample receptacles (and the received samples) without impairing movement of the chain per se. The chain drive may moreover be limited to the functions "ON/OFF". No further control is required. This facilitates the use of drives without electromotor (e.g. pneumatic or hydraulic drives).

The invention also comprises a nuclear magnetic resonance (NMR) spectrometer, comprising an inventive sample exchange device. It must be noted that within the scope of the present invention, other analytical spectrometers may also be provided with an inventive sample exchange device. An inventive spectrometer can be operated in an inexpensive fashion, i.e. with high throughput and little space requirements for the sample receptacles (i.e. for the local sample storage on the spectrometer), wherein disturbing electromotive robot arms in the vicinity of the measuring location can be avoided.

In a preferred embodiment, the chain drive is a pneumatic drive. A pneumatic drive has proven to be suitable in practice and does not influence the NMR measurement, in particular, not even when the separation between the driven components (in the present case, the chain) and the measuring volume is relatively small, i.e. less than 1 meter. The force of a pneumatic drive may basically be generated completely without electromotors (and therefore without disturbing permanent magnets) e.g. using an in-house compressed air supply or a local compressed air bottle. The location of a pneumatic drive, where the force is generated (e.g. a compressor) may also be easily disposed at a remote distance from the measuring location or measuring volume of the spectrometer, and the force is transmitted using a hose line (pressure line) to the driven component. In an alternative fashion, a hydraulic drive may be used, having similar advantages to a pneumatic drive.

In a further preferred embodiment of the NMR spectrometer, a drive for the chain is provided which has a sufficient separation from a measuring volume of the spectrometer, such that actuation of the drive does not disturb the NMR measurement of the spectrometer. This also increases the quality of the measuring results. The drive (to be more exact: the location, where the force is generated, i.e. an electromotor) in accordance with this embodiment is usually disposed a few meters away (preferably at least two meters away or also in another room) from the measuring volume which is disposed inside a cryostat. The force is transferred to the component to be moved by suitable means (e.g. a flexible shaft).

In another preferred embodiment of the inventive NMR spectrometer, the spectrometer comprises a cryostat with vertically aligned neck tube, and the transfer position is disposed above the cryostat in the extension of the neck tube. In this case, the transfer of a sample or a sample container from the sample receptacle at the transfer position to the measuring location (measuring volume) in the neck tube and back is particularly facilitated, and comprises exclusively one vertical motion of the sample.

The sample is preferably transferred only by a gas flow (e.g. an air flow or nitrogen flow) and gravity.

Further advantages of the invention can be extracted from the description and the drawing. The features mentioned above and below may be used in accordance with the invention either individually or collectively in arbitrary combination. The embodiments shown and described are not to be understood as exhaustive enumeration but have exemplary character for describing the invention.

The invention is illustrated in the drawing and explained in more detail with reference to embodiments.

BRIEF DESCRIPTION OF THE DRAWING

FIG. 3 shows a schematic inclined view of a chain section of the chain of FIG. 2a.

DESCRIPTION OF THE PREFERRED EMBODIMENT

Figure 1:
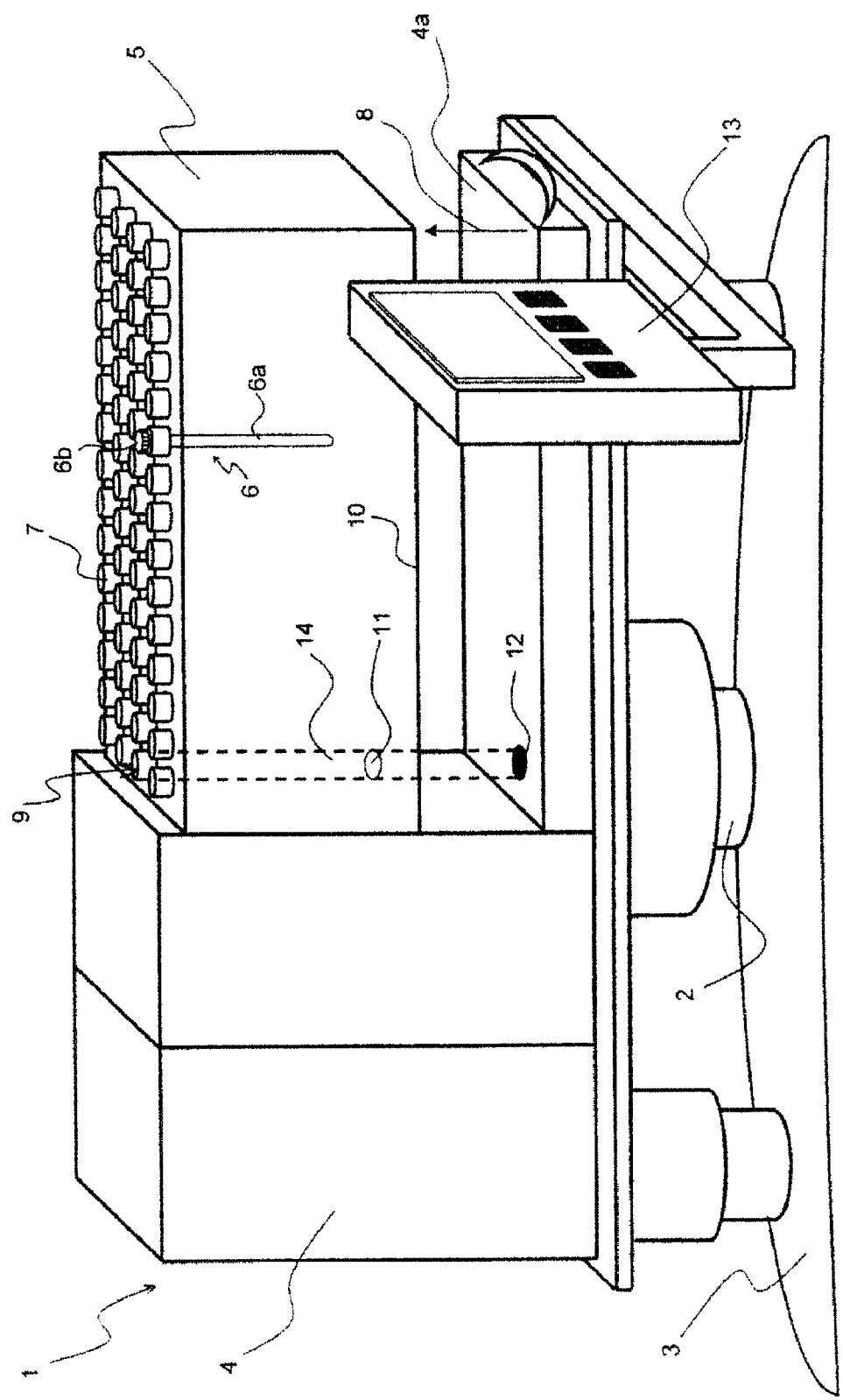
FIG. 1 shows a schematic view of an inventive sample exchange device.

FIG. 1 schematically shows an inclined view of an embodiment of an inventive sample exchange device 1.

The sample exchange device 1 is part of an NMR spectrometer. The NMR spectrometer, which is only partially shown in FIG. 1, has a measuring volume inside a vertical neck tube 2 of a cryostat 3. Only the upper part of the cryostat 3 is shown in FIG. 1. The cryostat 3 houses superconducting magnet coils which are cooled using liquid helium. A measuring head is located in the area of the measuring volume (measuring location of the samples).

The sample exchange device 1 comprises a basic part 4 which is permanently installed on the cryostat 3, and a cassette 5 for samples 6. The cassette 5 comprises a chain that circulates on a meandering path, and comprises a plurality of sample receptacles 7 with samples (for chain, refer to FIGS. 2a, 2b, 3). FIG. 1 shows only one sample 6 in one of the sample receptacles 7 for reasons of clarity. The sample 6 comprises a sample tube 6a, which contains the sample material to be investigated (e.g. a protein as the measuring substance in an aqueous solution), and a sample holder 6b which is clamped on the sample tube 6a and closes it. The sample holder 6b facilitates mounting of the sample 6 in the sample receptacle 7. The cassette 5 can be reversibly mounted on a cassette receptacle 4a of the basic part 4 and can be easily removed from the basic part 4 and replaced. This enables fast and simple exchange of the entire sample set. The cassette 5 in FIG. 1 is shown in a lifted-off position (see arrows 8).

Each of the sample receptacles 7 in the cassette 5 can be displaced within the cassette 5 to a transfer position 9. A sample 6 which is disposed in the sample receptacle 7 at the transfer position 9 can be spectroscopically measured. Towards this end, the basic part 4 has a transfer means which is not shown in detail (sample supply system of the spectrometer), with the aid of which the sample 6 can be inserted into the neck tube 2 and back.

In the illustrated embodiment, the transfer position 9 is positioned directly above the neck tube 2 such that no horizontal motion is required for transporting the sample 6 into the neck tube 2. An opening 11 is provided at the bottom 10 of the cassette 5 through which the sample 6 can be guided. The basic part 4 moreover has an opening 12 for the sample 6 in order to lower the sample into the NMR spectrometer. The transport channel 14 for the sample 6 is indicated in FIG. 1 with dashed lines. The transfer means preferably transports the sample 6 in the transport channel 14 with a gas flow that interacts with gravity.

The cassette 5 may have further openings (in FIG. 1 e.g. on the left-hand side) in order to facilitate access of the transfer means to the sample 6.

The basic part 4 has a pneumatic drive (not shown in detail) for moving the chain together with the sample receptacles 7. The drive and the transfer means are driven by an electronic control means 13.

Figure 2A:
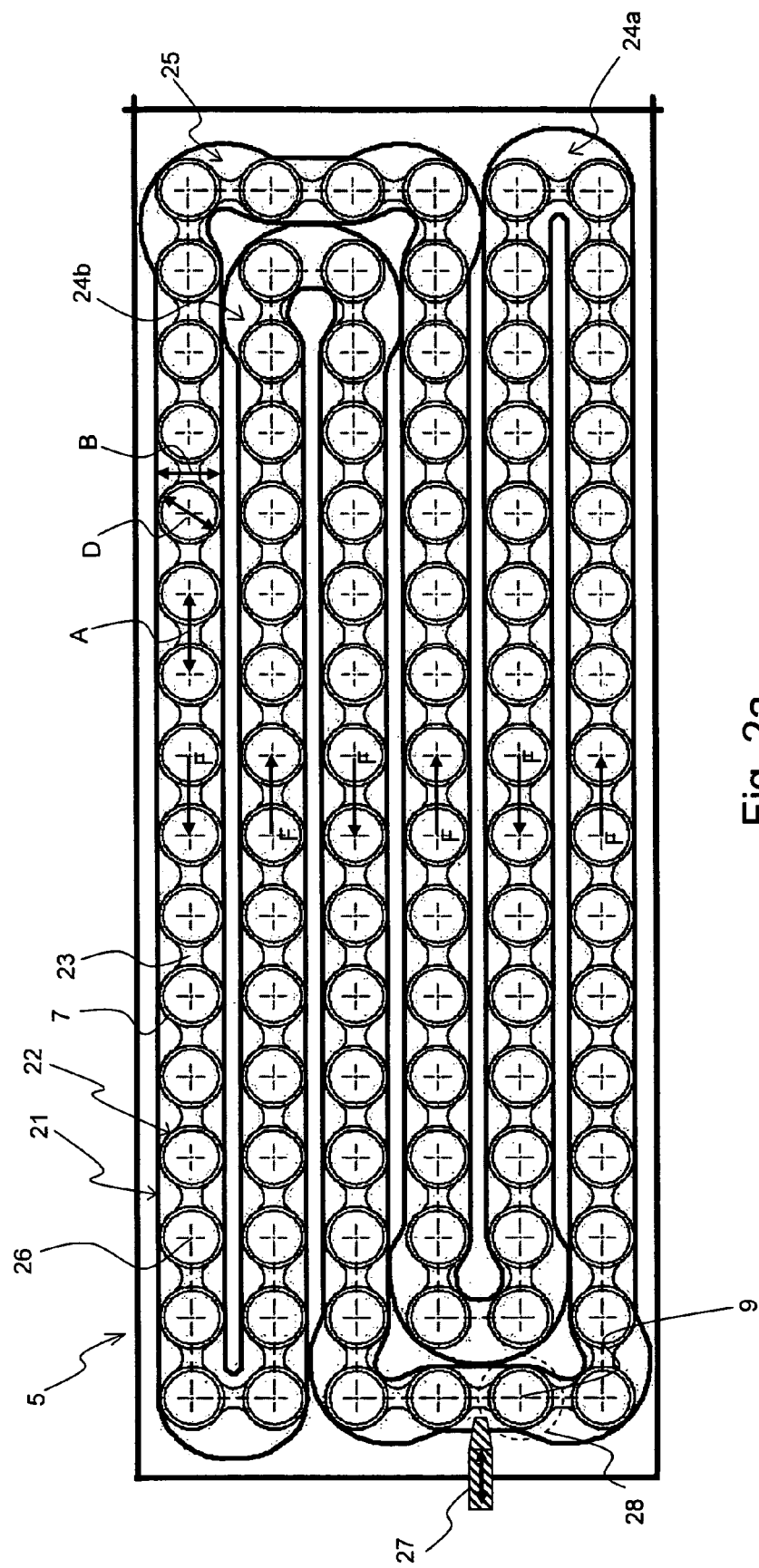
FIG. 2a shows a schematic top view of a cassette of an inventive sample exchange device, comprising a circumferential chain that extends in a guiding channel.

FIG. 2a shows a top view of a cassette 5 with an inventive sample exchange device which is comparable to the cassette of FIG. 1.

The cassette 5 has a flat closed guiding channel 21, which is designed as a depression in a flat, plate-shaped material block (preferably produced of non-ferromagnetic material, also metal such as aluminium or brass, or also plastic material). A circumferential chain 22 extends in the guiding channel 21. The chain 22 consists of approximately annular sample receptacles 7 and webs 23 connecting them. Each sample receptacle 7 has the function of a hinge in the chain 22 (refer to FIG. 3). The separation between the neighboring sample receptacles 7 in the chain 22 (member distance A) is fixed and always the same.

The guiding channel 21 has a width B which corresponds substantially to the outer diameter D of the sample receptacles (B is actually slightly larger than D), such that the sample receptacles 7 are guided in the guiding channel 21.

The guiding channel 21 is only formed of straight sections, 180° curves 24a, 24b and 90° curves 25. The guiding channel is slightly bulged at the curves. It must be noted that two different types 24a, 24b of 180° curves are provided. The overall guiding channel 21 extends in a meandering shape. It has six parallel, longer rows (in FIG. 2a extending from the left to the right-hand side) and 16 shorter columns. The guiding channel 21 is composed of nested and merging loops, namely substantially of two large loops (rows 1 and 4, counted from the top with the loop end on the right-hand side; and rows 3 and 6, left-hand side) and four small loops (rows 1 and 2, left-hand side; rows 2 and 3, right-hand side; rows 4 and 5, left-hand side; rows 5 and 6, right-hand side). The wall design of the guiding channel 21 in the area of the curves 24a, 24b, 25 cooperates with the design of the chain 22 (in particular the outer contours of the sample receptacles 7 and webs 23 and the ratio between the chain member distance A and the outer diameter D of the sample receptacles 7) in such a fashion that the chain 22 can remain free of tension during movement in the guiding channel 21. In the illustrated embodiment, A/D=1.29.

Figure 2B:
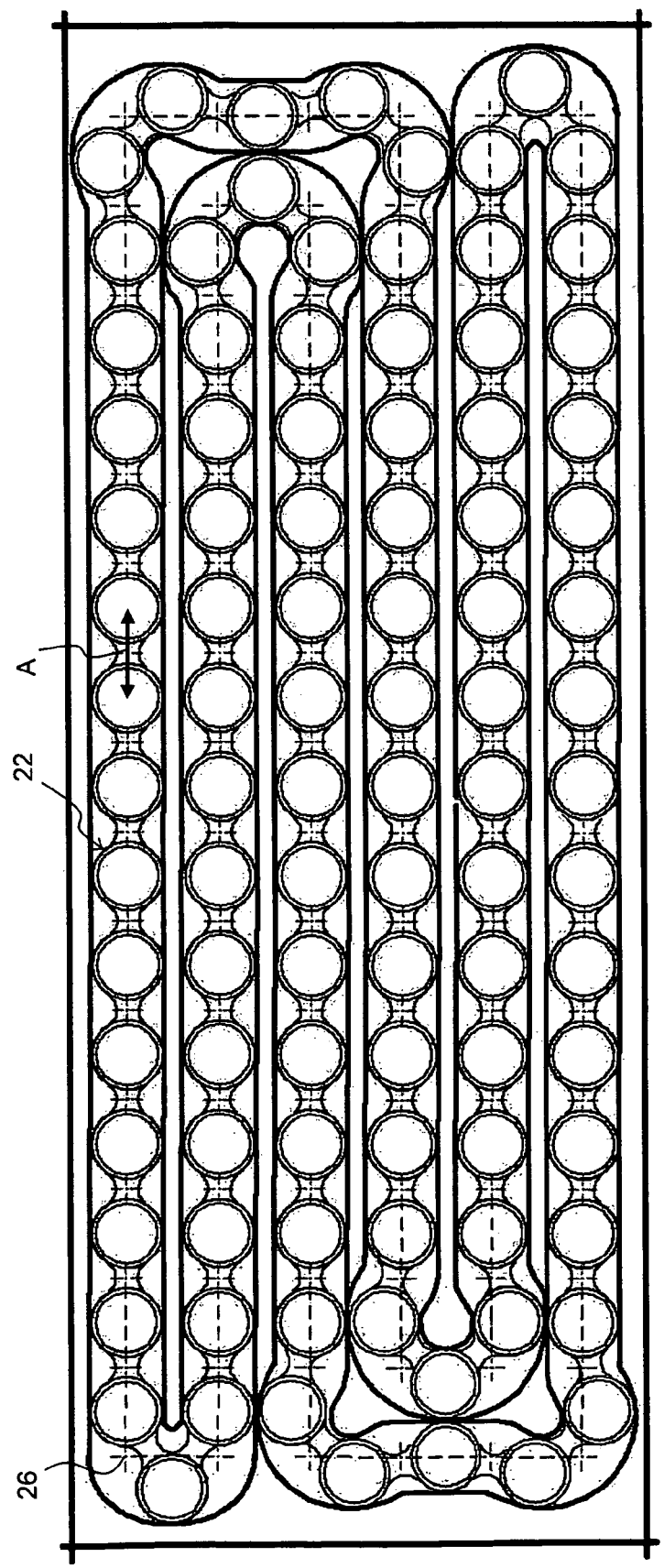
FIG. 2b shows a schematic top view of the cassette of FIG. 2a, wherein the chain has been moved by half a chain member distance.

The transport position of the chain 22 in FIG. 2a is such that the sample receptacles 7 form a square grid in a rectangular surface area. The centers of the sample receptacles 7 are thereby marked with small crosses 26. In contrast thereto, FIG. 2b shows a transport position of the chain 22 which is displaced by half a chain member separation A. For comparison, in FIG. 2b, the crosses 26 of FIG. 2a were transferred in order to illustrate the displacement more clearly. In this transport position, the square grid is not maintained in the region of the curves.

The explanations below refer again to FIG. 2a. In the illustrated embodiment, the chain 22 is moved by a pneumatic drive. The drive is separate from the cassette 5 and only engages the chain 22 with individual components. A conveying mechanism (not shown in detail), e.g. a sliding bolt, is provided approximately in the center of the chain 22 for each row of the six rows of the guiding channel 21. Each row simultaneously engages the chain 22, shifting it in the direction of arrow F. It must be noted that neighboring rows are thereby shifted in opposite directions in each case.

Shifting is typically effected in steps in accordance with the chain member separation A in order to move each subsequent sample receptacle 7 to a transfer position 9. A sample of a sample receptacle 7 at the transfer position 9 can be moved to the measuring location (see FIG. 1 in the neck tube of the cryostat) and be measured. A retractable stop 27 is provided at the transfer position 9 which can block movement of the chain 22 when a sample receptacle 7 has reached the exact transfer position 9. This facilitates positioning of the sample receptacle 7 and the pneumatic drive does not require any particular control for positioning. For moving the chain further (when measurement of the instantaneous sample has been completed), the stop 27 is retracted from the chain 22 and drawn in again in time for the next desired positioning.

An opening 28 that can be closed is located at the transfer position 9 in the bottom of the guiding channel 21 which facilitates transfer of the sample downwards to the measuring location.

Figure 3:
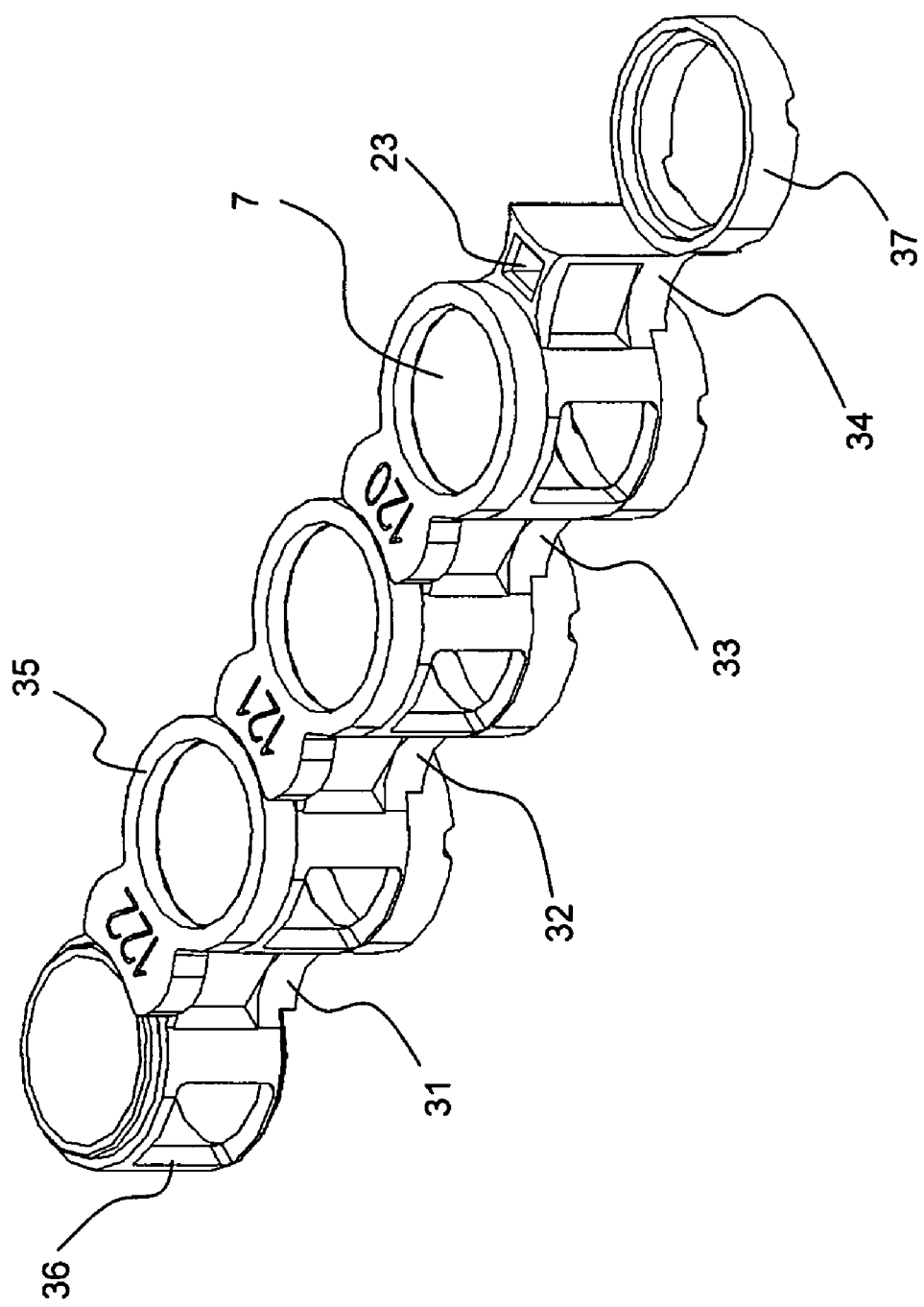

FIG. 3 shows a schematic inclined view of a section of the chain of FIG. 2a with four chain members 31-34 and three cap elements, each with engravings 122, 121, 120. The approximately annular sample receptacles 7 and the webs 23 alternate in the chain. Each sample receptacle 7 is composed of an upper ring 35 (that belongs to a cap element 122, 121, 120), a central ring 36 and a lower ring 37. Each chain member 31-34 comprises a central web 23 and a central ring 36 on one side and a lower ring 37 on the opposite side. Each central ring 36 can be rotated with respect to the upper ring 35 and the lower ring 37 on a sample receptacle 7.

Machine-readable codes may be provided on the chain members 31-34 (e.g. on the webs 23) or the cap elements for facilitating identification of the sample receptacles 7 or the transported samples. In the illustrated embodiment, engraved code numbers 122, 121, 120 are provided on the cap elements 122, 121, 120 so that the transported samples can also be identified with the naked eye.

We claim:

1. A spectrometer having a sample exchange device, the sample exchange device comprising:
   a housing defining a transfer position;
   a circumferential chain disposed on said housing, said chain having sample receptacles disposed in said chain at equal distances, said sample receptacles being connected to each other via webs, wherein each sample receptacle can be moved to said transfer position by moving said chain; and
   a chain guidance disposed on said housing to guide said circumferential chain along a meandering path, wherein the sample exchange device comprises a cassette in which a meandering self-contained guiding channel is formed as said chain guidance.

2. The spectrometer of claim 1, wherein a width B of said guiding channel substantially corresponds to an outer diameter D of said sample receptacles.

3. The spectrometer of claim 1, wherein said guiding channel is exclusively built from straight sections, 90° bends, and/or 180° bends.

4. The spectrometer of claim 3, wherein walls of said guiding channel in said bends and outer contours of said sample receptacles and webs are designed in such a fashion that a length of said chain is not changed while it moves around said bends.

5. The spectrometer of claim 1, wherein said cassette comprises a cassette bottom which has a bottom opening for passage of a sample at said transfer position.

6. The spectrometer of claim 1, wherein a movable closing mechanism is provided for closing an opening in said guiding channel at said transfer position.

7. The spectrometer of claim 1, wherein said sample receptacles form a square grid in a transport position of said chain.

8. The spectrometer of claim 1, further comprising a retractable stop for aligning said sample receptacles with respect to said transfer position.

9. The spectrometer of claim 1, wherein the spectrometer is a nuclear magnetic resonance (NMR) spectrometer.

10. The NMR spectrometer of claim 9, further comprising a pneumatic drive for said chain.

11. The NMR spectrometer of claim 9, further comprising a drive for said chain, said drive having a sufficient separation from a measuring volume of the spectrometer, such that actuation of said drive does not disturb NMR measurement of the spectrometer.

12. The NMR spectrometer of claim 9, wherein the spectrometer comprises a cryostat having a vertically aligned neck tube, said transfer position being disposed above said cryostat in extension of said neck tube.

13. A spectrometer having a sample exchange device, the sample exchange device comprising:
   a housing defining a transfer position;
   a circumferential chain disposed on said housing, said chain having sample receptacles disposed in said chain at equal distances, said sample receptacles being connected to each other via webs, wherein each sample receptacle can be moved to said transfer position by moving said chain; and
   a chain guidance disposed on said housing to guide said circumferential chain along a meandering path, wherein $2 \geq A/D \geq 5/4$, D being an outer diameter of said sample receptacles and A a separation between neighboring sample receptacles on said chain, measured from center to center.

14. The spectrometer of claim 13, further comprising a drive which drives said chain at at least two different drive locations.

15. The spectrometer of claim 14, wherein a number of drive locations corresponds to a number of rows of sample receptacles of said sample exchange device.

* * * * *